United States Patent [19]

Sanders

[11] Patent Number: 4,539,562
[45] Date of Patent: Sep. 3, 1985

[54] LOAD CURRENT MONITORING DEVICE FOR DETECTING PREDETERMINED DEGREE OF CHANGE IN LOAD IMPEDANCE

[75] Inventor: Gary G. Sanders, Lakewood, Ohio

[73] Assignee: The Scott & Fetzer Company, Cleveland, Ohio

[21] Appl. No.: 454,716

[22] Filed: Dec. 30, 1982

[51] Int. Cl.³ ............................................. G08B 21/00
[52] U.S. Cl. .................................... 340/657; 340/640; 307/350
[58] Field of Search ............... 340/657, 664, 640, 635; 361/79; 307/350, 355, 362; 328/147; 324/51, 52, 62

[56] References Cited

U.S. PATENT DOCUMENTS

| | | | |
|---|---|---|---|
| 2,449,739 | 9/1948 | Duttera | 340/664 X |
| 2,912,622 | 11/1959 | Warrington | 361/79 X |
| 3,934,239 | 1/1976 | Mason et al. | 340/664 |
| 4,203,095 | 5/1980 | Wilson, Jr. | 340/657 X |
| 4,389,640 | 6/1983 | Dawdy | 340/640 X |
| 4,421,976 | 12/1983 | Jurek | 340/640 X |

FOREIGN PATENT DOCUMENTS 1072265 12/1959 Fed. Rep. of Germany ...... 340/657
52-28642 3/1977 Japan ..................................... 361/79

Primary Examiner—James L. Rowland
Assistant Examiner—Brian R. Tumm
Attorney, Agent, or Firm—Pearne, Gordon, Sessions, McCoy, Granger & Tilberry

[57] ABSTRACT

Current provided to a generally constant impedance load is monitored to detect a predetermined load current decrease not resulting from normal load voltage fluctuations, such decrease indicating an abnormal increase in load impedance. A latching alarm is actuated when the predetermined load current decrease is detected. The degree of load current decrease tolerable without activating the alarm is determined by a user-adjustable percentage-of-change sensitivity control. A logic gate blocks alarm functions when the load current decreases to an abnormally low level. The disclosed device can be used to monitor the status of a line voltage energized heat trace cable constituted by a plurality of parallel-connected resistance wire heating elements. Multiple monitoring devices can be used in conjunction with a master alarm which can be reset without resetting the particular monitoring device alarm that triggered the master alarm.

10 Claims, 3 Drawing Figures

4,539,562

LOAD CURRENT MONITORING DEVICE FOR DETECTING PREDETERMINED DEGREE OF CHANGE IN LOAD IMPEDANCE

BACKGROUND OF THE INVENTION

The present invention relates in general to monitoring devices for detecting abnormal conditions in a circuit consuming electrical power, and more particularly to a load current monitor for detecting a change in load current that indicates an abnormal variance in load impedance.

A monitoring device in accordance with the present invention is especially useful for monitoring the status of a heat trace cable constituted by a large plurality of parallel connected resistance wire heating elements physically positioned serially along the length of the cable.

One or more heat trace cables are often wrapped around lengths of exposed chemical process piping to maintain the piping at a predetermined temperature. It is important to monitor the status of the cable in a manner that will determine when one or more of the many parallel heating elements burns out, i.e., open circuits, thus raising the overall impedance of the cable, thereby lowering its heating ability.

It is known in the art to utilize a current transformer to monitor only the load current flowing into a heat trace cable. Over a period of time, as individual heating elements in the cable burn out and fail, the overall cable impedance gradually rises to decrease the load current, the current transformer providing to associated cable control circuitry a signal indicating the current decrease. At a predetermind degree of load current decrease, the control circuitry indicates an "underheating" alarm condition for the monitored cable. The defective cable can then be replaced with a new one, or other corrective action may be taken.

The sensitivity of such a heat trace cable "current only" monitoring technique must necessarily be limited to account for load voltage fluctuations induced by commercially supplied line voltage used to directly power the heat trace cable. Commercially supplied line voltage often varies and fluctuates over a normal range, as is well known in the art. A decrease in the supplied voltage (commercial line voltage) will cause a decrease in load current for a constant impedance, non-defective, heat trace cable. This load voltage, fluctuation-caused current decrease does not indicate a cable failure (i.e., underheating). Thus, the sensitivity of the above-described load current monitor is limited to avoid false indications of cable failure for normal load voltage fluctuations.

It is desirable to provide a load current monitor for a heat trace cable, or other generally constant impedance load that disregards load current changes caused by fluctuations in applied load voltage, e.g., commercial line voltage.

It would also be desirable to provide alarm circuitry working in conjunction with a plurality of current-monitored heat trace cables, such alarm circuitry being, at least in part, resettable without having to correct one or more faulty cable of the many being monitored by use of the common alarm circuitry.

SUMMARY OF THE INVENTION

In accordance with the present invention, a device is provided for detecting changes in load impedance by detecting changes in load current that are not induced by fluctuations (e.g., a decrease) in the applied line voltage. The device includes means for sampling the load current and load voltage. A value indicative of the sampled current is compared to a preset reference value after the value indicative of the load current has been corrected, by a signal derived from the sampled voltage, to negate the effect on such current sample value of fluctuations in the applied load voltage. Thus, a predetermined change in the load current relative to the reference value indicates a change in load impedance.

In further accordance with the invention, an alarm circuit is provided for monitoring the status of one or more current monitor devices of the type noted immediately above. The alarm circuit includes at least one latching alarm connected to another latching alarm via an interconnecting circuit wherein triggering and latching of said one latching alarm causes, via the interconnecting circuit, the triggering and latching of the said another latching alarm. The interconnecting circuit serves to isolate and buffer the latched alarms from each other subsequent to their triggering to permit each alarm to be independently reset. A plurality of unit alarms can be used to trigger a single master alarm via the interconnecting circuit which can be constituted by one or more edge-triggered monostable (one-shot) circuits.

The load current monitoring device, in conjuntion with the alarm circuitry, can be used to very accurately monitor the status of a plurality of heat trace cables energized by a commercial power source. Other applications of the invention are also contemplated, such as motor monitoring, wherein an increase in motor current not caused by an increase in applied motor voltage could be indicative, for example, of pending motor bearing failure, transient overloads, and the like.

BRIEF DESCRIPTION OF THE DRAWINGS

A fuller understanding of the invention may be had by referring to the following description and claims taken in conjunction with the accompanying drawings, wherein:

DETAILED DESCRIPTION OF THE PREFERRED EMBODIMENT

Figure 1:
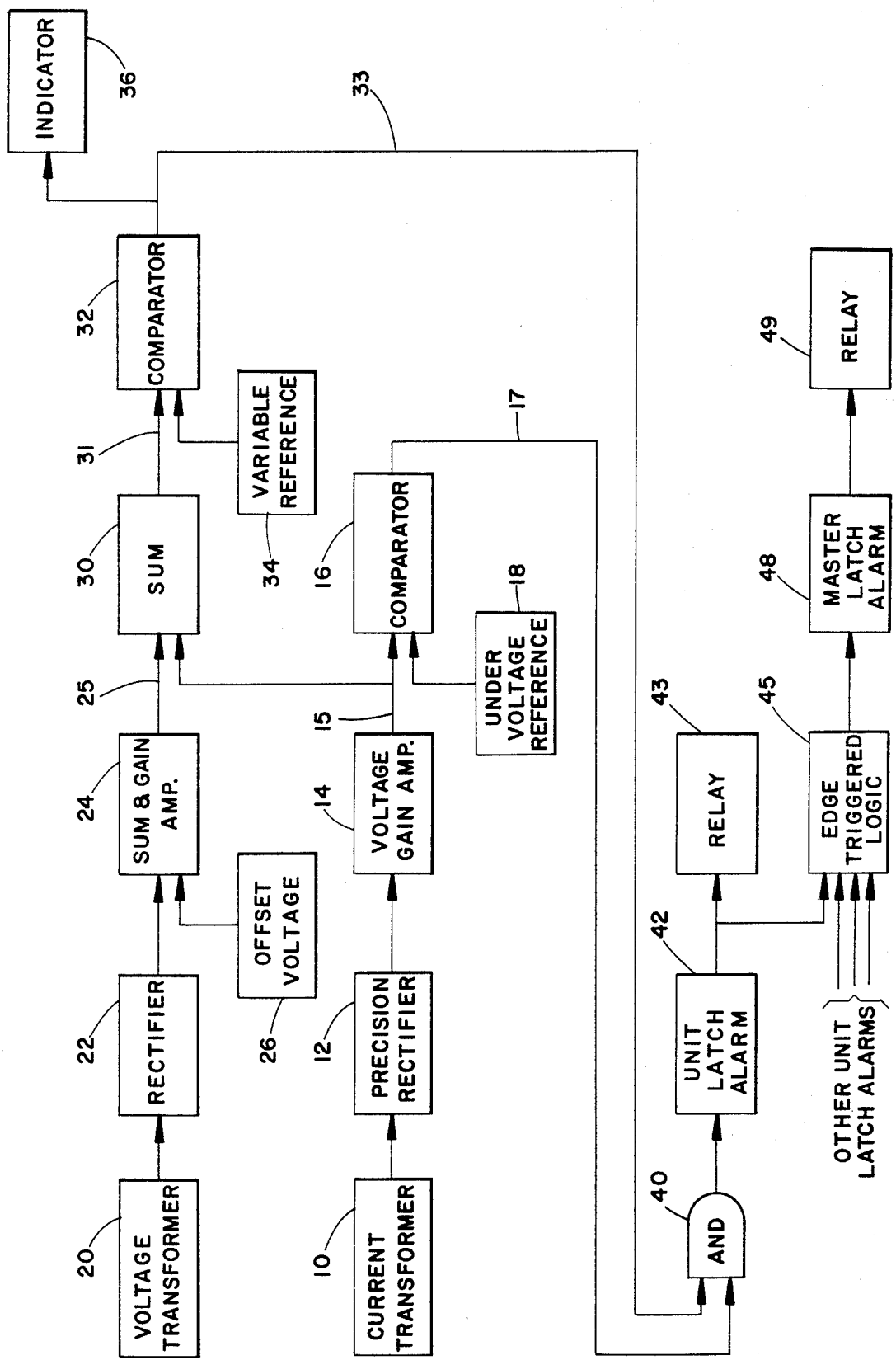
FIG. 1 is a block diagram of circuitry constituting a preferred embodiment of the invention.

With reference to FIG. 1, there is illustrated, in block diagram fashion, an electronic circuit comprising a device for detecting changes in load impedance by detecting changes in load current that are not induced by fluctuations in the applied load voltage. The circuitry of FIG. 1 is intended for use in monitoring alternating current provided to a generally constant impedance load by a commercial power source. However, it is to be recognized that the present invention has applications in other environments, such as to the monitoring of dc current provided to a load by a dc voltage source (assuming appropriate input transducers), as will be apparent to one skilled in the art. Further, the load can be constituted by a pure resistive impedance, such as a resistance wire formed heat trace cable, or by an impedance including reactive components.

A load current sensing transformer 10 is connected in circuit in series with a load to sample the amount of alternating load current provided to what is normally a generally constant impedance load, such as a heat trace cable. The alternating load current sample is fed to a precision load current sample rectifier 12 that provides at its output a signal indicative of the value of the load current, such as a dc signal proportional to the amount of alternating load current being provided to the load.

A voltage transformer 20 is connected in parallel across the load to sample the amount of ac voltage being applied to the load by, for example, commercial power lines constituting an alternating current source. The sampled amount of load voltage provided by the voltage sensing transformer 20 is supplied to a load voltage sample rectifier 22 that provides at its output a signal indicative of the value of the load voltage, such as a dc signal proportional to the amount of voltage applied to the load.

The output of load current sample rectifier 12 is, for example, constituted by a dc voltage signal that increases negatively in direct proportion to an increase in current provided to the load. In similar fashion, the output of the load voltage sample rectifier 22 is constituted by a dc voltage signal that increases in direct proportion to an increase in the amount of voltage applied to the load.

The output of the load current sample rectifier 12 is fed to a variable gain amplifier 14, which in turn provides, on an output line 15, a first signal indicative of the amount of current provided to the load, this first signal increasing in proportion to an increase in the amount of current provided to the load.

The output of the load voltage sampler rectifier 22 is provided to a summing amplifier 24, which is also provided with an offset voltage 26, the offset voltage being of such polarity that when added to the output of load voltage sample rectifier 22 at nominal line voltage, there is provided on line 25 a second dc voltage signal that varies in inverse proportion to the load voltage, i.e., as the load voltage increases, the amplitude of the second dc signal on line 25 decreases (i.e., increases negatively).

The first and second dc voltage signals on lines 15 and 25 are algebraically added in a summer 30 to provide a third dc voltage signal on summer output line 31. The nature of the first, second, and third signals can be more readily understood with reference to FIG. 2, wherein the signals on lines 15, 25, and 31 are graphically illustrated.

Figure 2:
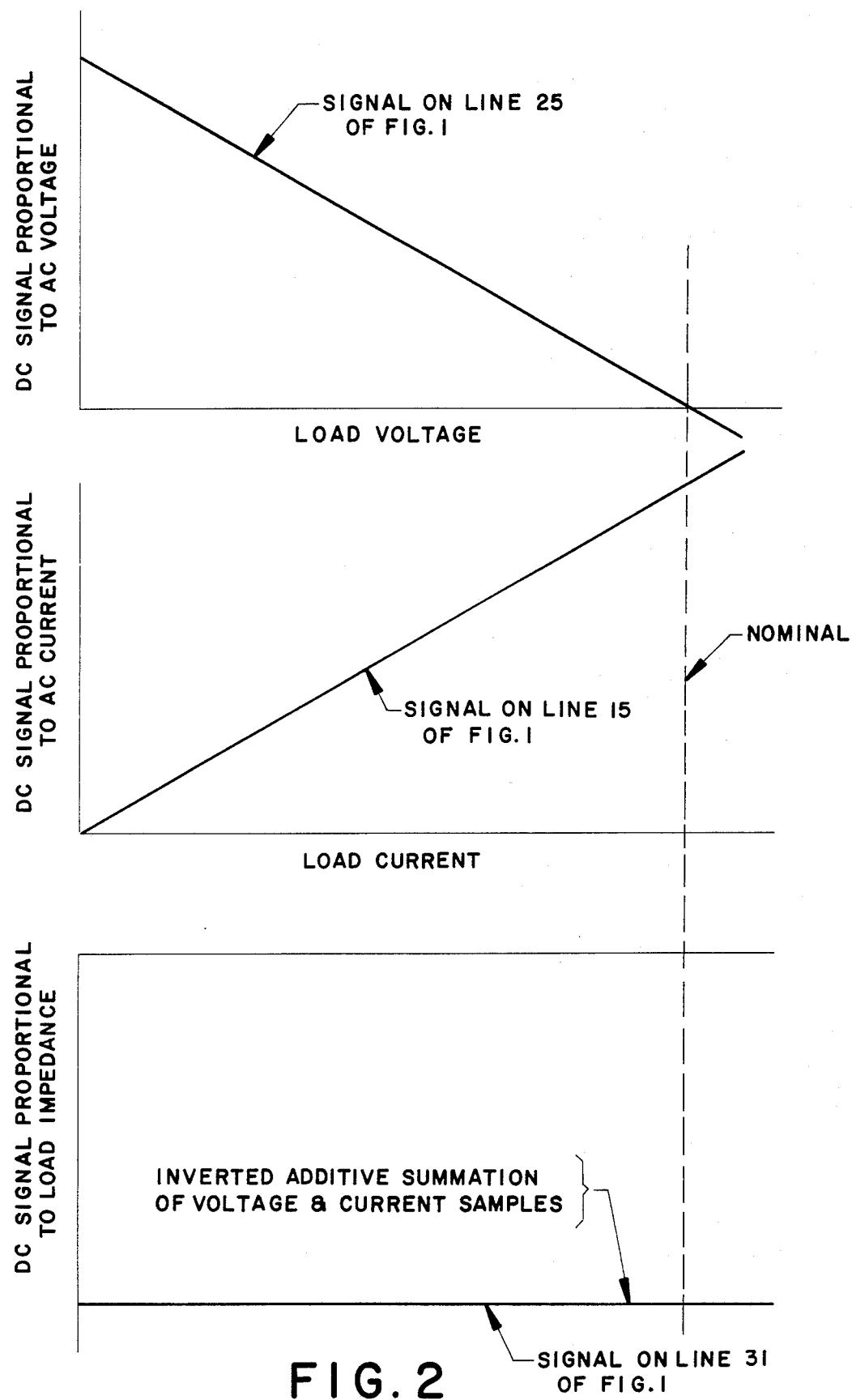
FIG. 2 is a graphical representation of operating parameters of the circuitry of FIG. 1.

With reference to the top graph in FIG. 2, it can be seen that for an increasing load voltage, the signal on line 25 of FIG. 1 decreases from a maximum value at zero or minimal load voltage, to a zero value at nominal line voltage such as 117 volts ac commercial line voltage, and to a minimum value at a higher than nominal load voltage. Thus, the dc signal proportional to the ac voltage provided to the load decreases as the load voltage, i.e., the applied line voltage, increases. The slope of the signal on line 25, as graphically illustrated, is determined by the gain of amplifier 24, rectifier 22, and transformer 20 (see FIG. 1).

With further reference to the middle graph of FIG. 2, it can be seen that the dc signal proportional to the ac current provided to the load increases as the load voltage increases, reaching a normal value that is preset by variable gain amplifier 14, for a given load, independent of applied line voltage, i.e., load voltage.

Variable gain amplifier 14 (see FIG. 1) is used to match the slope of the load current indicative signal on line 15 (first signal) to the slope of the load voltage indicative signal (second signal) on line 25, as can be seen by comparing the top and middle graphs of FIG. 2 to each other. Thus, the rate of change in the signals on line 25 and line 15 are identical but for their direction, i.e., the signal on line 25 decreases at a rate equal to the amount of increase in the signal on line 15. It is to be noted that the signals represented in FIG. 2 (top and middle graphs) are idealized to be exactly linear for purposes of illustration. It will be apparent to those skilled in the art that actual signals on lines 15 and 25 may be somewhat non-linear. For example, current transformer 10, if of a conventional current-to-voltage type, will be non-linear in performance, especially at low load current levels. Compensation for this low-level non-linearity will be further discussed.

With reference to the bottom graph of FIG. 2, the third signal on line 31 is derived by algebraically adding and voltage inverting the signals illustrated in the top and middle graphs, i.e., the signals on line 25 and line 15. By matching the slope of the signal on line 15 to that of the signal on line 25, the inverted additive summation of these signals will provide the generally constant value signal on line 31, as illustrated. Thus, the signal on line 31 constitutes a third dc signal voltage that is proportional to load impedance over a varying range of load voltage that will normally fluctuate by a predetermined degree, as is well known in the art with regard to commercial line power.

For a decrease in the amount of line voltage applied to the load, the current will decrease by an equal proportion so as to still provide the generally constant signal on line 31, thus indicating that the impedance of the load has not changed. In other words, a decrease in load current was caused by a decrease in applied load voltage, and not by an increase in load impedance. In effect, the circuitry of FIG. 1 thus far discussed constitutes means for defining at a selected value of load impedance a reference function (as illustrated in the bottom graph of FIG. 2) of sampled load current against sampled load voltage throughout a range of load voltages to thereby establish a reference value of current for each value of load voltage throughout the range. Further, such circuitry, including summer 30, constitutes signal generating means for presenting two signals (lines 15,25—middle and top graphs of FIG. 2) corresponding respectively to sampled load current and sampled load voltage as complementary additive signals summed as a single output signal (line 31—bottom graph of FIG. 2). It can be seen that the summer 30 thus defines a reference function, the summer 30 presenting an output signal as a constant value throughout a range of load voltages at the selected value of load impedance.

After the circuitry of FIG. 1, as so far discussed, is calibrated to provide the signals graphically illustrated in FIG. 2, the current and voltage transformers 10,20 constitute means for continuously monitoring the load voltage and load current.

With further reference to FIG. 1, the third dc voltage signal indicative of the load impedance is provided to a comparator 32 that is provided with a variable (within bounds) reference value 34, the comparator 32 providing a signal on an alarm trigger signal line 33 when the third dc voltage signal indicative of load impedance varies from the preset reference value 34 by a predetermined degree.

For example, the reference value 34 is constituted by a dc voltage that is compared to the normally constant dc voltage of the signal on line 31. It can be seen that the signal on line 31 remains generally constant in spite of load voltage fluctuations until a change in load impedance occurs.

When an alarm signal is present on line 33, an indicator 36 will be energized to indicate that the impedance of the load has varied by a predetermined degree from its normally constant level. The indicator 36 is also utilized in calibrating the subject current monitoring circuit to a particular load impedance, as will subsequently be detailed.

In further accordance with the invention, FIG. 1 illustrates an alarm circuit for use in conjunction with the foregoing elements of the load current detector which indicates a change in load impedance.

Preferably, the first dc signal on line 15 indicative of the amount of load current is provided to a comparator 16, which is also provided with a reference value 18, e.g., a fixed dc voltage. An enable line 17 constituted by the output of the comparator 16 functions as an alarm lockout, i.e., when the signal on line 15 decreases to a degree determined by the value of the reference 18, the comparator output will provide a nonenabling signal to preclude a signal on the alarm trigger line 33 from activating the alarm circuit to be discussed below. This non-enabling function is important to preclude false alarm triggering caused by the earlier discussed non-linearity of the current transformer 10 at low current levels and to account for component variations that could produce false alarms at extremely low current/low voltage levels.

Preferably, the undervoltage reference 18 is set to ensure an alarm disabling signal on line 17 when the current falls to a point indicative of, for example, an applied line voltage, i.e., load voltage, at or below 12 volts ac (approximately one-tenth of nominal line voltage). Thus, the earlier discussed circuitry would operate over a load voltage range of from 12 volts ac to, for example, 130 or 150 volts ac (a high line voltage condition).

The alarm circuitry of FIG. 1 includes a logic gate 40 configured as an AND gate having two inputs, one input provided with a trigger signal on line 33 and the other input provided with a normally enabling signal on line 17. The output of the AND gate 40 is provided to latch a unit latch alarm 42 when comparator 32 switches states, thus indicating that the load impedance has deviated by an amount determined by the reference value 34. The unit latch alarm 42, once triggered, will hold an alarm condition as long as fault conditions prevail, and in turn actuate a unit alarm indicator 43 constituted, for example, by a relay for controlling an alarm means such as a buzzer or light and/or a load disconnecting means, such as a circut breaker.

In addition to providing an activating signal to the alarm indicator 43, the unit latch alarm 42, when latched, provides a signal to an edge triggered logic circuit 45 that drives a master latching alarm 48, which in turn drives a master alarm indicator 49, such as a relay for controlling a signal light, buzzer, circuit breaker, or the like. The edge-triggered logic circuit 45 constitutes an interconnecting circuit between the unit latch alarm 42 and the master latch alarm 48. As will hereinafter be illustrated in greater detail, a plurality of load monitoring devices as discussed earlier, each having a unit latch alarm 42, are connected by the interconnecting circuit 45 to the master latch alarm 48. The interconnecting circuit 45 constitutes means for isolating and buffering the unit latched alarms from each other and from the master latch alarms 48 so that each can be reset independently from a latched to an unlatched condition. Thus, if the load monitored by transformers 10,20 changes in terms of its impedance, the unit latch alarm illustrated as block 42 in FIG. 1 will trip the master latch alarm 48. However, because of the buffering and isolating effect of interconnecting circuit 45, the master latch alarm 48 can be reset, while the tripped unit latch alarm remains in a latched condition, thus indicating that the load being monitored by it continues to be in an abnormal impedance condition. Since the master latch alarm 48 has been reset, it can continue to function so as to monitor the remaining unit latch alarms. Thus, the alarm circuitry illustrated in FIG. 1 can be used in conjunction with a plurality of loads each being monitored by a current detecting means of the type discussed earlier.

Figure 3:
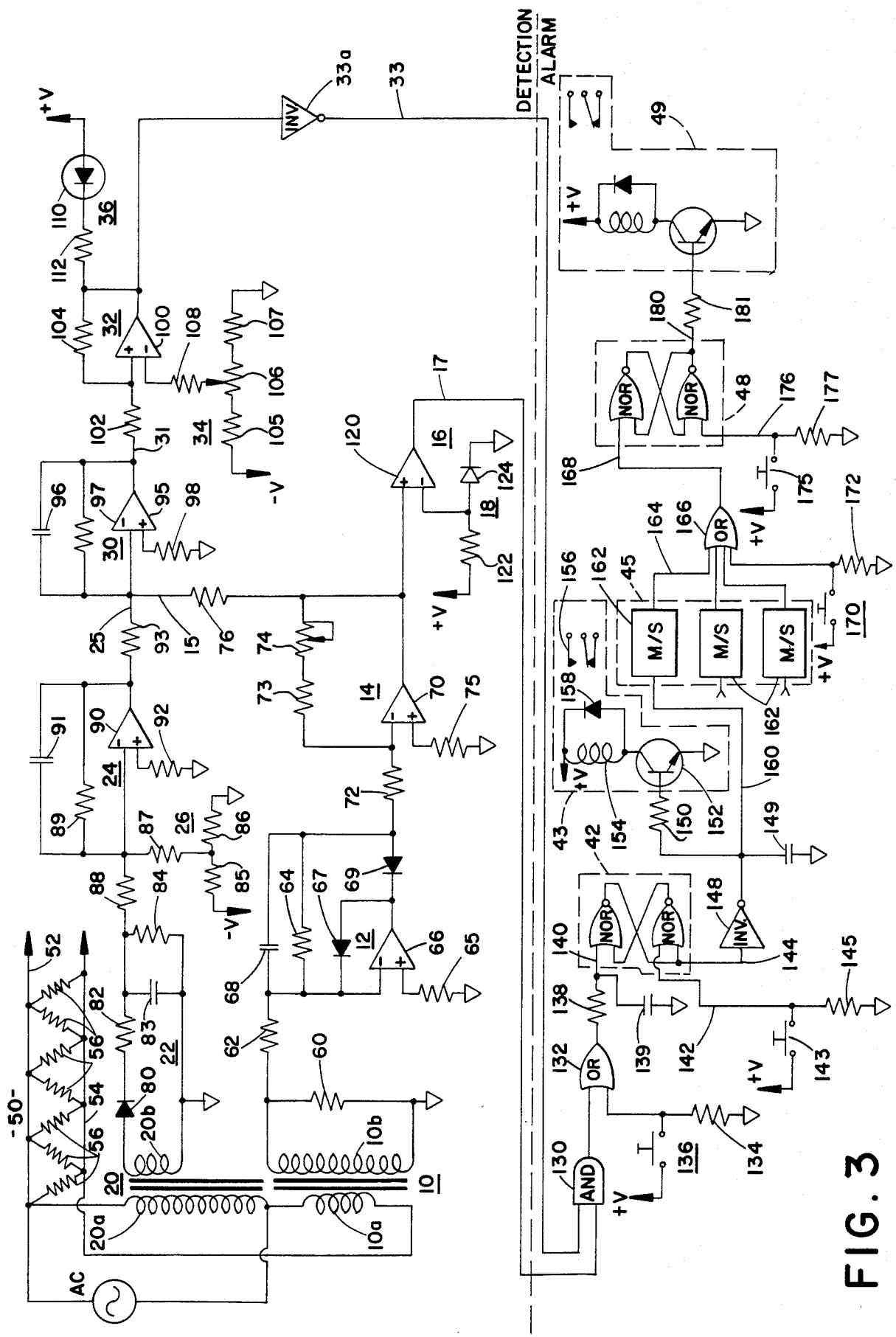
FIG. 3 is a detailed schematic diagram of a discrete component circuit in accordance with the block diagram representation of FIG. 1.

A more detailed illustration of preferred circuitry for accomplishing the functions discussed with regard to the block diagram of FIG. 1 and the graphs of FIG. 2 is illustrated in detailed schematic fashion in FIG. 3 as a discrete component circuit powered by a conventional bipolar dc supply.

As noted earlier, the load current monitoring device, in conjunction with the earlier-discussed alarm circuitry, is particularly useful for monitoring the status of a conventional heat trace cable 50 comprised of a pair of parallel conductors 52, 54 that extend the full length of the cable. Connected in parallel across the conductors 52, 54 are a large plurality of resistance wire heating elements 56, the parallel-connected elements 56 being serially positioned along the length of the heating cable. It is desirable to determine when a predetermined number or percentage of the heating elements 56 burn out or open circuit, wherein the ability of the cable 50 to generate heat is decreased.

As illustrated in FIG. 3, the heat trace cable 50 is energized by an ac commercial power (e.g., 117, 208 or 230 Vac) source. The amount of line voltage, i.e., the load voltage applied to the generally constant impedance load constituted by the cable 50, is sensed by the load voltage sensing transformer 20, which includes a primary winding 20a connected in parallel across the load, and an isolated voltage reducing secondary winding 20b providing a load voltage sample. While the primary winding 20a is connected in parallel across the heat trace cable 50, the primary winding 10a of a current-tovoltage transformer, constituting the load current sensing transformer 10, is connected in series with the load as illustrated so as to sense the amount of load current provided to the heat trace cable 50. The load current flowing through the primary winding 10a causes an induced voltage in the isolated secondary winding 10b of the transformer 10, the secondary winding 10b being loaded by a resistor 60 so as to provide an alternating current-induced voltage constituting a load current sample, the voltage across resistor 60 being proportional to the current through the heat trace cable 50.

The signal voltage across the resistor 60 is provided by a resistor 62 to the inverting input of an operational amplifier 66 conventionally configured as an integrating, half-wave, precision rectifier. An integrating feedback capacitor 68 is connected between the inverting input of operational amplifier 66 and its output via a first rectifying diode 69 that works in conjunction with a second rectifying diode 67 to provide the half-wave rectifying function of the operational amplifier 66. The resistor 62 and another resistor 64, connected in parallel with the integrating capacitor 68, constitute gain setting means for the operational amplifier 66, which has its non-inverting input tied to ground or neutral via an appropriate compensating resistor 65.

The output voltage of the operational amplifier 66 constitutes the output of the precision load current sample rectifier 12 discussed earlier with regard to FIG. 1. Such output voltage is provided via a series resistor 72 to the inverting input of an operational amplifier 70 constituting the primary component of the variable gain amplifier 14 discussed earlier with regard to FIG. 1. The gain of the operational amplifier 70 is determined by the associated gain setting resistors comprised of series resistor 72 and resistors 73 and 74 connected in series across the inverting input and output of operational amplifier 70. Resistor 74 is adjustable to provide means for matching the slope of the current function illustrated in the middle graph of FIG. 2 to that of the voltage function illustrated in the top graph of FIG. 2. The non-inverting input of operational amplifier 70 is tied to ground in a conventional fashion by compensating resistor 75. The output of operational amplifier 70 is provided to line 15 via a current summing resistor 76.

Thus, the voltage on line 15 is directly proportional to the amount of load current provided to the heat trace cable 50 constituting a generally constant impedance load. In other words, the voltage on line 15 as illustrated in FIG. 3 (also see FIG. 1), will increase in proportion to an increase in the load current in heat trace cable 50, the rate of increase being determined by the gain setting (adjustment of resistor 74) of operational amplifier 70.

The output of operational amplifier 70 is also fed directly to the non-inverting input of an operational amplifier 120 constituting the primary component of the undervoltage comparator 16 discussed with regard to FIG. 1. The operational amplifier 120 is configured as a voltage comparator. A reference voltage is supplied to the operational amplifier's inverting input by the interconnection junction of a series-connected resistor 122 and the forward biased diode 124. As noted earlier with regard to FIG. 1, the operational amplifier 120 will develop an alarm lockout signal on line 17 unless the load current-indicative dc voltage at its non-inverting input is greater than the reference voltage supplied at its inverting input.

With reference to the secondary winding 20b of the load voltage sensing transformer 20, the induced voltage in the secondary winding 20b is rectified by a half-wave rectifying diode 80, and is then voltage divided and filtered by a conventional network of resistors 82, 84 and capacitor 83, as illustrated. These noted components constitute the voltage sample rectifier 22 as illustrated and discussed earlier with reference to FIG. 1.

The rectified dc voltage across resistor 84 is directly proportional to the load voltage, i.e., for an increase in the amount of load voltage across cable 50 a proportional increase in the voltage across resistor 84 will occur, this voltage being fed via summing resistor 88 to the inverting input of an operational amplifier 90, which is conventionally configured as an integrating, inverting summing amplifier. The offset voltage value 26 discussed with respect to FIG. 1 is provided by a voltage divider network comprised of two resistors 85, 86, the voltage at their interconnection junction being fed to the inverting input of operational amplifier 90 via summing resistor 87. The integration effect of the operational amplifier 90 is provided by a conventional feedback capacitor 91 connected between the output of the operational amplifier 90 and its inverting input, as illustrated, with resistors 87, 88, and a third resistor 89 (connected in parallel with capacitor 91) functioning in a known manner to set the gain of the operational amplifier 90. In a conventional fashion, its non-inverting input is tied to ground via a compensating resistor 92.

The offset voltage provided via resistor 87 is summed with the voltage provided via resistor 88 so as to provide at the output of operational amplifier 90 the inverse dc signal proportional to the ac load voltage, as illustrated in the top graph of FIG. 2, as discussed earlier. This voltage on line 25 is provided, via a summing resistor 93, with the load current indicative signal on line 15, to a summing junction at the inverting input of an operational amplifier 95 configured as an integrating, inverting amplifier with a gain of unity. The gain of the operational amplifier 95 is determined by resistors 76 and 93 in conjunction with resistor 97. A conventional feedback integrating capacitor 96 functions with the operational amplifier 90 to provide, under normal conditions, a generally constant dc signal on line 31, as illustrated in the bottom graph of FIG. 2.

The operational amplifier 95 and its associated components serve as the summer 30 to algebraically add the first dc signal proportional to the ac current (line 15) and the second dc signal inversely proportional to the ac voltage (line 25). It can be seen that for a constant impedance in the load constituted by the heat trace cable 50, the dc voltage on line 31 will remain constant over a range of load voltages determined by the degree of fluctuation in the line voltage of the 117 Vac commercial supply.

This dc voltage on line 31 is provided via a resistor 102 to the non-inverting input of another operational amplifier 100, constituting the primary component of comparator 32 discussed earlier with regard to FIGS. 1 and 2. The operational amplifier 100 is configured as a voltage comparator with hysteresis to preclude oscillation when the voltages at the inputs of operational amplifier 100 are nearly identical. Thus, when the voltages at the inputs of operational amplifier 100 are close enough to cause a switchover at the operational amplifier output, the operational amplifier 100 will, in effect, latch at a switched condition until the voltage difference at the inputs of the operational amplifier 100 exceed that permitted by the hysteresis band.

The inverting input of the operational amplifier 100 is connected via a resistor 108 to a voltage divider constituted by series-connected resistors 105, 106, and 107. Resistor 106 is a potentiometer-type, variable resistor that is adjustable to vary the amount of voltage applied to the inverting input of operational amplifier 100. It is the voltage provided via resistor 108 that constitutes the variable reference 34 illustrated and discussed with regard to FIG. 1. When the voltage at the non-inverting input of operational amplifier 100 increases above the reference voltage at its inverting input, a change of state will occur at the output of amplifier 100, thus providing a trigger signal on line 33 to the alarm circuitry, which will be discussed subsequently. The hysteresis band of the amplifier 100 is set by resistors 102 and 104. A change in the output state of the operational amplifier 100 is indicated by a light-emitting diode 110 connected in series with the current-limiting resistor 112 to the output of operational amplifier 100, the resistor 112 and light-emitting diode 110 constituting the indicator 36, discussed earlier with regard to FIG. 1.

When a predetermined number of heat trace cable heating elements 56 burn out, the impedance of the cable will increase to provide a decrease in load current that is not caused by a decrease in load voltage. Thus, the generally constant dc signal on line 31 will increase so as to trigger an alarm circuit via line 33, the predetermined degree of current decrease tolerable being determined by the adjustment of the potentiometer 106, which is user-adjustable and scaled in percentage of change (such as 0 to 20%) relative to the initial nominal current value (see FIG. 2).

Thus, the operational amplifier 100 and its related component constitute means for comparing at any sampled load voltage within a range of load voltages the present value of the load current then sampled with the reference value called for by the defined function (see bottom graph of FIG. 2). Any difference signified by the comparison thus indicates a change in load impedance. In effect, the reference input at the inverting input of operational amplifier 100 constitutes a constant value defined function against which is compared the present value of the output signal from operational amplifier 90.

The initial setup of the circuitry so far disclosed will now be discussed. For operational setup, the sensitivity-controlled variable resistor 106 is set to establish the most negative voltage reference level (e.g., −6.24 Vdc where −0.24 Vdc equals the hysteresis band voltage and −6 Vdc is the nominal amplitude) at the inverting input of operational amplifier 100. With the monitored load attached and energized, i.e., heat trace cable 50 energized, the current gain control constituted by variable resistor 74 is advanced (e.g., non-inverting input set just slightly more negative than −6.24 Vdc) until the output of operational amplifier 100 changes states, as evidenced by lighting of the light-emitting diode 110. The slope matching resistor 74 is then adjusted to decrease its resistance value to a point wherein the light-emitting diode 110 just extinguishes, thus indicating that the slopes of the top and middle graphs of FIG. 2 are matched, as discussed earlier. This setup technique automatically nulls all off-set errors and allows a highly sensitive balancing of the detecting circuitry. The sensitivity control potentiometer 106 (now set for 0% current change sensitivity) is then advanced to the desired percentage of change indication in load current from nominal that will cause a triggering at the output of operational amplifier 100. For example, the potentiometer 106 would be set at 10% to cause a tripping of the alarm when the load current decreases by 10% from its nominal value at nominal line voltage.

The alarm circuitry illustrated in the lower portion of FIG. 3 will now be discussed. With the load current above a predetermined level, as required by operational amplifier 120 functioning as comparator 16, and with operational amplifier 100 indicating a decreased current condition indicative of a predetermined increase in load impedance, i.e., a predetermined decrease in the heating capability of the cable 50, the inputs to an AND gate 130 (constituting logic gate 40) will both be at a high logic level 1 (AND gate input on line 33 being provided via an inverter 33a to provide required logic level 1 state) to provide an output to a two-input OR gate having its other input tied to ground via a resistor 134. The input of the OR gate tied to resistor 134 can be directly tied to the positive voltage of the bipolar power supply via a push button 136, constituting a push-to-test button.

With the AND gate 130 providing a high state logic level trigger signal to the OR gate 132, the OR gate will output, via a timed delay resistor 138 functioning with the timed delay capacitor 139, a trigger signal to the trigger input 140 of the unit latching alarm 42 constituted, as illustrated, by a pair of conventionally cross-coupled NOR gates forming a set-reset latch. A reset input 142 of the unit latching alarm 42 is tied to ground via a resistor 145, the reset input 142 being connected to the positive voltage of the bipolar power supply when the reset push button 143 is depressed. An alarm state output 144 for the unit latching alarm 42 is provided via an inverter 148 (having its output connected to ground via a capacitor 149 that reduces line reflections, i.e. a despiking capacitor) to a unit alarm indicator 43 via a current limiting resistor 150. The resistor 150 provides the drive signal to the base of a transistor 152 for energizing a relay winding 154 controlling relay contacts 156, the relay winding 154 being paralleled by a conventional freewheeling snubber diode 158.

It is to be noted that, contrary to convention, the output on line 144 is constituted by the output of the NOR gate having trigger input 140, this feature advantageously precluding alarm toggling (during reset) that would occur if the output to alarm indicator 43 were constituted by the output of the other NOR gate in accordance with normal convention for cross-coupled NOR gate pairs.

It can be seen that when the unit alarm 42 is latched, i.e., when it is triggered at its input 140 by a signal on line 33 caused by the changing state of operational amplifier 100 or by depressing push-to-test button 136, the transistor 152 will be turned on to change the state of the contacts 156 to activate an acoustical alarm, such as a buzzer or a lighting means or other alarm means.

In further accordance with the invention, the unit latching alarm 42 can be connected to a master latching alarm 48, also constituted by a pair of crosscoupled NOR gates, as illustrated. Such alarms are interconnected via the interconnecting circuit 45, which, for example, is comprised of one or more edge-triggered, monostable (one-shot) multivibrator circuits 162, the number of monostable circuits depending on the number of heat trace cables and current monitoring devices being utilized.

The master latching alarm 48 includes a triggered input 168, a reset input 176, and an alarm state output 180. The reset input 176 is normally tied to ground via a resistor 177. The reset push button 175, when depressed, will connect the reset input 176 of the master latching alarm 48 to positive voltage of the bipolar supply.

When the unit alarm 42 latches, a positive-going signal change occurs on a monostable circuit input trigger line 160, the monostable circuit 162 changing states to provide, via an OR gate 166, a trigger input to the master alarm 48. The master alarm output 180 will in turn provide, via current-limiting resistor 181, a drive signal to the master alarm indicator 49, including components generally identical to the unit alarm 43, as discussed above.

In addition to the reset push button 175, the master alarm 48 is also affected by a push-to-test push button 170 connected to one of the inputs of the OR gate 166, which is normally tied to ground via resistor 172.

Testing of the alarm circuitry will now be discussed. It can be seen that when test push button 136 is depressed, a signal will be provided to trip the unit latching alarm 42 and latch it in a condition which will continuously drive the transistor 152 into saturation. Simultaneously with the tripping of the unit latch 42, the master latching alarm 48 will be tripped via its associated monostable circuit 162 having its input 160 connected to the output of the unit output line 144 of the unit latching alarm 42 via the inverter 148. It is to be noted that the master alarm 48 could also be tripped for testing independent of the unit latching alarm 42 by depressing the test push button 175. To reset the master alarm, push button 175 is depressed. Since the monostable circuit 162 is positive edgetriggered, it will effectively isolate the master alarm from retriggering by the still-latched unit latching alarm 42. Thus, the monostable circuit 162 only changes states in response to the unit latching alarm 42 changing from an unlatched to a latched condition. For a continuous triggering signal on line 33, the unit latching alarm 42 will remain latched, while the master latching alarm 48 can be reset so as to monitor other heat trace cables which have not experienced an undercurrent condition When the heat treat cable associated with the illustrated unit latching alarm 42 is replaced or repaired (or current sensitivity is readjusted), the signal on line 33 will reverse to a non-triggering condition, thus allowing a reset of the unit latching alarm 42 by depression of the reset push button 143.

It can be seen that a plurality of unit latching alarms (such as 42) are connected to a like plurality of edge-triggered monostable circuits 162, each monostable circuit providing a change-of-state-indicating output only when its associated unit latching alarm changes from an unlatched to a latched condition.

The trigger input 168 of the master alarm, being connected to the output of each of the monostable circuit outputs, can thus function to monitor multiple heat trace cable undercurrent detecting units while still maintaining the capability to be independently reset in spite of a latched condition in one of the unit latch alarms.

It is to be noted that while the circuitry illustrated in FIG. 3 is set up to detect a predetermined decrease in load current indicative of an increase in load impedance, appropriate circuit modifications could easily be made to detect a predetermined increase in load current caused by a decrease in load impedance, or to detect both increase and decreases in load impedance relative to a single reference value. Such a feature is clearly within the scope of the present invention. It is also again noted that the illustrated circuitry could be used to sense dc load currents and voltages, whereby numerous components (such as transformers 10, 20 and rectifiers 12, 22) in the circuitry of FIG. 3 could be deleted.

It should also be evident that this disclosure is by way of example and that various changes may be made by adding, modifying, or eliminating details without departing from the fair scope of the teaching contained in this disclosure. The invention is therefore not limited to particular details of this disclosure except to the extent that the following claims are necessarily so limited.

What is claimed is:

1. A device for detecting changes in load impedance by detecting changes in load current that are not induced by fluctuations in the applied load voltage comprising:

means for monitoring the current provided to the load, said current monitoring means providing a dc voltage signal having an amplitude proportional to the amount of load current;

means for monitoring the voltage applied to the load, said voltage monitoring means providing another dc voltage signal having an amplitude proportional to the amount of load voltage; and means responsive to said dc signals, said responsive means comparing a value indicative of the monitored current to a preset reference value, the said value indicative of the monitored current being corrected prior to said comparing by means of a correction signal derived from the monitored voltage to negate the effect on the value indicative of monitored current of fluctuations in the load voltage, the said responsive means indicating a predetermined change in load current relative to said reference value resulting solely from a predetermined change in load impedance.

2. A device for detecting changes in load impedance by detecting changes in load current that are not induced by fluctuations in the applied load voltage comprising:

means for monitoring the current provided to the load, said current monitoring means providing a dc voltage signal having an amplitude proportional to the amount of load current;

means for monitoring the voltage applied to the load, said voltage monitoring means providing another dc voltage signal having an amplitude porportional to the amount of load voltage;

means for defining at a selected desired value of load impedance a reference function of monitored load current against monitored load voltage throughout a range of load voltages to thereby establish a reference value of current for each value of load voltage throughout said range; and means for comparing at any value of monitored load voltage within said range the present value of the load current then monitored with the reference value called for by said defined function, whereby any difference indicated by said comparison signifies a change in load current independent of load voltage fluctuations, and therefore signifies a change in load impedance.

3. A device according to claim 2, wherein said monitoring means is arranged to present said dc signals corresponding respectively to monitored load current and monitored load voltage as complementary additive signals summed as a single output signal, said means for defining a reference function including means to present said output signal as a constant value throughout said range of load voltages at said selected desired value of load impedance, said means for comparing being arranged to compare the present value of said output signal with said constant value whereby a difference in said values corresponds to a change in load impedance.

4. A device for detecting changes in a generally constant load impedance by detecting changes in load current that are not induced by fluctuations in the applied load voltage, comprising:

means for generating a first dc voltage signal whose value is indicative of the amount of current provided to the load;

means for generating a second dc voltage signal whose value is indicative of the amount of voltage applied to the load, one of said signals increasing at a rate generally equal to the rate of decrease in the other of said signals when said impedance is generally constant and said load voltage fluctuates;

means for algebraically summing the first and second signals, the summing means providing a generally constant value third dc voltage signal proportional to the generally constant load impedance; and means responsive to the third signal for indicating that the third signal value has deviated to a predetermined degree from its normally constant value, thus indicating an abnormal fluctuation in the generally constant load impedance.

5. A device according to claim 4, including a comparator means provided with said third signal and a user-adjustable constant value reference signal, said comparator means providing an output signal when the said third signal deviates by a predetermined percentage of change from the reference signal.

6. A device according to claim 4, including an alarm means triggered by said means responsive to the third signal.

7. A device according to claim 4, wherein the value of the first signal is proportional to the load current and wherein the value of the second signal is proportional to the load voltage throughout a range of load voltage fluctuations.

8. A device according to claim 4, wherein said load current is alternating and said source is an alternating current providing voltage source, said first dc voltage signal increasing in proportion to an increasing load current, said second dc voltage signal decreasing in proportion to an increasing load voltage, the rate of said dc voltage increase and said dc voltage decrease being approximately equal.

9. A device according to claim 8, including isolation transformer means for monitoring said load voltage, means connected to the isolation transformer means for rectifying a voltage indicative of a portion of the load voltage to provide a dc voltage increasing in proportion to an increase in load voltage, and summation means provided with the said dc voltage and an offset voltage of predetermined value, the summation means adding the said dc voltage and the offset voltage to provide said second dc voltage signal constituted by a dc voltage that decreases in proportion to an increase in load voltage.

10. A device according to claim 8, including isolation transformer means for monitoring said load current, and means connected to the isolation transformer means for rectifying a voltage indicative of a portion of the load current to provide said first dc voltage signal constituted by a dc voltage increasing in proportion to an increase in load current.

* * * * *